United States Patent
Huang et al.

(10) Patent No.: US 12,231,118 B2
(45) Date of Patent: Feb. 18, 2025

(54) MINIMUM ON-TIME CIRCUIT, CONTROLLER, CIRCUIT SYSTEM AND CURRENT DETECTION METHOD

(71) Applicant: HANGZHOU BRIGHT POWER SEMICONDUCTOR CO., LTD., Hangzhou (CN)

(72) Inventors: He Huang, Hangzhou (CN); Danzhu Lv, Hangzhou (CN)

(73) Assignee: HANGZHOU BRIGHT POWER SEMICONDUCTOR CO., LTD., Hangzhou (CN)

( * ) Notice: Subject to any disclaimer, the term of this patent is extended or adjusted under 35 U.S.C. 154(b) by 96 days.

(21) Appl. No.: 18/324,707

(22) Filed: May 26, 2023

(65) Prior Publication Data
US 2023/0387913 A1 Nov. 30, 2023

(30) Foreign Application Priority Data
May 27, 2022 (CN) .......................... 202210594705.5

(51) Int. Cl.
H03K 17/693 (2006.01)
H03K 17/10 (2006.01)
H03K 17/687 (2006.01)

(52) U.S. Cl.
CPC ......... *H03K 17/693* (2013.01); *H03K 17/102* (2013.01); *H03K 17/687* (2013.01)

(58) Field of Classification Search
None
See application file for complete search history.

(56) References Cited

U.S. PATENT DOCUMENTS

| 7,126,802 B2 * | 10/2006 | Ishikawa ............ H03K 17/0828 361/94 |
| 2009/0058383 A1 | 3/2009 | Ryoo |
| 2010/0237837 A1 | 9/2010 | Wang et al. |
| 2011/0204860 A1 | 8/2011 | Thiele et al. |

FOREIGN PATENT DOCUMENTS

| CN | 103997225 A | 8/2014 |
| CN | 105449996 A | 3/2016 |
| CN | 106160483 A | 11/2016 |

(Continued)

*Primary Examiner* — Kenneth B Wells
(74) *Attorney, Agent, or Firm* — MUNCY, GEISSLER, OLDS & LOWE, P.C.

(57) ABSTRACT

A minimum on-time circuit, a controller, a circuit system and a current detection method are disclosed, the minimum on-time circuit is capable of configuring an extended minimum on-time length longer than a normal minimum on-time length for a transistor switch. Under a condition where there is a need for current detection through the transistor switch within the minimum on-time, the minimum on-time may be extended from the shorter normal minimum on-time length to the longer extended minimum on-time length, thereby ensuring successful current detection within the minimum on-time of the transistor switch. Under any other condition, the transistor switch may be configured, as needed, to have the normal minimum on-time length. This enables improved system safety and controllability, while exerting a minimized impact on system performance.

17 Claims, 4 Drawing Sheets

(56) References Cited

FOREIGN PATENT DOCUMENTS

| CN | 111555615 A | 8/2020 |
|---|---|---|
| CN | 113285650 A | 8/2021 |
| CN | 114128131 A | 3/2022 |
| JP | 2009118633 A | 5/2009 |
| JP | 2011114883 A | 6/2011 |

* cited by examiner

Fig. 1

Prior Art

MINIMUM ON-TIME CIRCUIT, CONTROLLER, CIRCUIT SYSTEM AND CURRENT DETECTION METHOD

CROSS-REFERENCES TO RELATED APPLICATIONS

This application claims the priority of Chinese patent application number 202210594705.5, filed on May 27, 2022, the entire contents of which are incorporated herein by reference.

TECHNICAL FIELD

The present invention relates to the field of current detection technology and, in particular, to a minimum on-time circuit, controller, circuit system and current detection method.

BACKGROUND

In the field of power management and power devices (e.g., DC-DC and AC-DC conversion, motor driving, etc.), current detection is a very common function enabling current mode control, constant current output, over-current protection and so forth. Current detection is usually carried out during a turn-on time of an output transistor to sample a current through the output transistor to enable processing of the current. Since the sampling and processing of the current would take some time, in order to ensure successful detection of the current, a minimum on-time of the output transistor is required to be not less than the time required for the sampling and processing of the current.

In a high-frequency switched-mode power supply system, for example, if a PWM switch (i.e., an output transistor) operating at a frequency of 10 MHz or higher is required to have a duty cycle controlled at 5%, then its minimum on-time will be less than 5 ns, which is too short to allow current detection within this period. Without modifying the minimum on-time, this problem could not be overcome even when a high-speed current sampling technique is adopted. On the other hand, directly extending the minimum on-time may lead to a performance degradation of the high-frequency switched-mode power supply system.

SUMMARY OF THE INVENTION

It is an objective of the present invention to provide a minimum on-time circuit, controller, circuit system and current detection method, which can overcome the problem of impossible detecting current within a minimum on-time and enable improved system safety and controllability, while exerting a minimized impact on system performance.

The above objective is attained by a minimum on-time circuit provided in the present invention, which includes: a normal minimum on-time module configured to output a first pulse signal based on a control signal for a transistor switch, wherein a pulse width of the first pulse signal is equal to a length of a normal minimum on-time of the transistor switch; an extended minimum on-time module configured to output a second pulse signal based on the control signal, a pulse width of the second pulse signal is equal to a length of an extended minimum on-time of the transistor switch, the length of an extended minimum on-time of the transistor switch is greater than the length of the normal minimum on-time; a selection module including an input terminal coupled to the normal and extended minimum on-time modules and an output terminal coupled to a gate of the transistor switch, the selection module configured to select one of the first and second pulse signals and provide it at the gate of the transistor switch; and a control module including an output terminal coupled to a control terminal of the selection module, the control module configured to cause the selection module to select and output the second pulse signal under a certain condition where there is a need for current detection within the minimum on-time of the transistor switch and to select and output the first pulse signal under any other condition except the certain condition.

Optionally, an input terminal of the control module may be coupled to a current detection circuit for detecting a current through the transistor switch wherein the control module is configured to be based on both the control signal or an input signal and an output signal of the current detection circuit to cause the selection module to select and output the second pulse signal under the certain condition.

Optionally, the control module may be configured to, under the certain condition, count the number of consecutive cycles of the control signal, or time a continuous period of time of the input signal, over which a current through the transistor switch cannot be detected, and when a predefined condition is met, cause the selection module to select and output the second pulse signal.

Optionally, when the selection module selects and outputs the second pulse signal and a current through the transistor switch is greater than a predetermined current, the output signal of the current detection circuit may transition from a low level to a high level, and in response to the second pulse signal transitioning from a high level to a low level, the output signal of the current detection circuit may transition from the high level to the low level.

Optionally, the control module may include a counter, which is configured to receive the control signal and the output signal of the current detection circuit and, under the certain condition, count the number of consecutive cycles of the control signal, over which a current through the transistor switch cannot be detected, and when the counted value reaches a counting threshold value, cause the selection module to select and output the second pulse signal.

Alternatively, the control module may include a timer, which is configured to receive the input signal and the output signal of the current detection circuit and, under the certain condition, time a continuous period of time of the input signal, over which a current through the transistor switch cannot be detected, and when the timed value reaches a timing threshold value, cause the selection module to select and output the second pulse signal.

Optionally, in response to the output signal of the current detection circuit transitioning from a low level to a high level, the counter or timer may be reset.

Optionally, the pulse width of the second pulse signal output from the extended minimum on-time module may be constant.

Optionally, the pulse width of the second pulse signal output from the extended minimum on-time module may be variable.

Optionally, the extended minimum on-time module may be coupled to the current detection circuit for detecting a current through the transistor switch and configured to receive the control signal and the output signal of the current detection circuit and output the second pulse signal, wherein when the selection module selects and outputs the second pulse signal, in response to the control signal transitioning from a low level to a high level, the second pulse signal transitions from a low level to a high level, and wherein when a current through the transistor switch exceeds the predetermined current, the output signal of the current detection circuit transitions from the low level to the high level, causing the second pulse signal to transition from the high level to the low level and thereby causing the output signal of the current detection circuit to transition from the high level to the low level.

Optionally, the extended minimum on-time module may include a flip-flop configured to receive the output signal of the current detection circuit and the control signal and output the second pulse signal, wherein in response to the control signal transitioning from the low level to the high level, the second pulse signal transitions from the low level to the high level, and wherein in response to the output signal of the current detection circuit transitioning from the low level to the high level, the second pulse signal transitions from the high level to the low level.

Based on the same inventive concept, the present invention further provides a controller including the minimum on-time circuit of the present invention, which is coupled to a gate of a transistor switch.

Optionally, the controller may further include a control signal generator circuit, a logic OR circuit and a current detection circuit, wherein an output terminal of the control signal generator circuit is coupled to both an input terminal of the minimum on-time circuit and a second input terminal of the logic OR circuit in order to be able to apply a control signal to the transistor switch, wherein a first input terminal of the logic OR circuit is coupled to an output terminal of the minimum on-time circuit and an output terminal of the logic OR circuit is coupled to the gate of the transistor switch in order to be able to provide a drive signal, wherein an input terminal of the current detection circuit is coupled to a source or drain of the transistor switch and an output terminal of the current detection circuit is coupled to the input terminal of the minimum on-time circuit, and wherein the current detection circuit is configured to detect a current through the transistor switch, provide an output signal based on a result of the detection and transmit the output signal to the minimum on-time circuit.

Optionally, the current detection circuit may include a current comparator including a first input terminal coupled to the source or drain of the transistor switch and a second input terminal for receiving a predetermined current, wherein when a current through the transistor switch exceeds the predetermined current, the output signal of the current detection circuit transitions from a low level to a high level.

Based on the same inventive concept, the present invention further provides a circuit system including a transistor switch and the controller of the present invention, wherein the transistor switch is integrated in the controller, or disposed outside of the controller.

Based on the same inventive concept, the present invention further provides a current detection method including: under a certain condition where there is a need for current detection within a minimum on-time of a transistor switch, causing the transistor switch to have an extended minimum on-time longer than a normal minimum on-time of the transistor switch; and under any other condition except the certain condition, causing, as needed, the transistor switch to have the normal minimum on-time.

Optionally, the current detection method may further include: applying a control signal to the transistor switch and, under the certain condition where there is a need for current detection within the minimum on-time of the transistor switch, counting the number of consecutive cycles of the control signal, over which a current through the transistor switch cannot be detected, and when the counted value reaches a counting threshold value, causing the transistor switch to have the extended minimum on-time longer than the normal minimum on-time; or providing an input signal and, under the certain condition where there is a need for current detection within the minimum on-time of the transistor switch, timing a continuous period of time of the input signal, over which a current through the transistor switch cannot be detected, and when the timed value reaches a timing threshold value, causing the transistor switch to have the extended minimum on-time longer than the normal minimum on-time.

Optionally, the extended minimum on-time is constant or variable.

Compared with the prior art, the present invention provides at least the following benefits:
1. Under a certain condition where there is a need for current detection through the transistor switch within the minimum on-time of the transistor switch, the minimum on-time may be extended from a shorter normal minimum on-time length to a longer extended minimum on-time length. Otherwise, under any other condition, the transistor switch may be configured, as needed, to have the normal minimum on-time length. In this way, successful current detection within the minimum on-time of the transistor switch can be ensured under the certain condition, while allowing the transistor switch to maintain the shorter minimum on-time length under any other condition. This enables improved system safety and controllability, while exerting a minimized impact on system performance.
2. The minimum on-time of the transistor switch can be easily extended either through counting the number of consecutive cycles of the control signal or timing a continuous period of time of the input signal, over which a current through the transistor switch cannot be detected. This approach is simple and easily implementable.

DETAILED DESCRIPTION

The following description sets forth numerous specific details in order to provide a more thorough understanding of the present invention. However, it will be apparent to those skilled in the art that the present invention can be practiced without one or more of these specific details. In other instances, well-known technical features have not been described in order to avoid unnecessary obscuring of the invention. It is to be understood that the invention may be embodied in many different forms and should not be construed as being limited to the embodiments set forth below. Rather, these embodiments are provided so that this disclosure is thorough and conveys the scope of the invention to those skilled in the art. In the drawings, like reference numerals refer to like elements throughout. It will be understood that when an element is referred to as being "connected to" or "coupled to" another element, it can be directly connected or coupled to the other element, or intervening elements may also be present. In contrast, when an element is referred to as being "directly connected to" another element, there are no intervening elements. As used herein, the terms "first", "second" and the like are intended to distinguish one element, component or portion from another element, component or portion. As used herein, the singular forms "a", "an" and "the" are intended to include the plural forms as well, unless the context clearly indicates otherwise. It will be further understood that the term "comprising" specifies the presence of stated features, steps, operations, elements, and/or components, but do not preclude the presence or addition of one or more other features, steps, operations, elements, components, and/or groups thereof. As used herein, the term "and/or" includes any and all combinations of the associated listed items.

The present invention will be described in greater detail below with reference to the accompanying drawings and to specific embodiments. From the following description, advantages and features of the present invention will become more apparent. Note that the drawings are provided in a very simplified form not necessarily drawn to exact scale for the only purpose of helping to explain the disclosed examples in a more convenient and clearer way.

Figure 1:
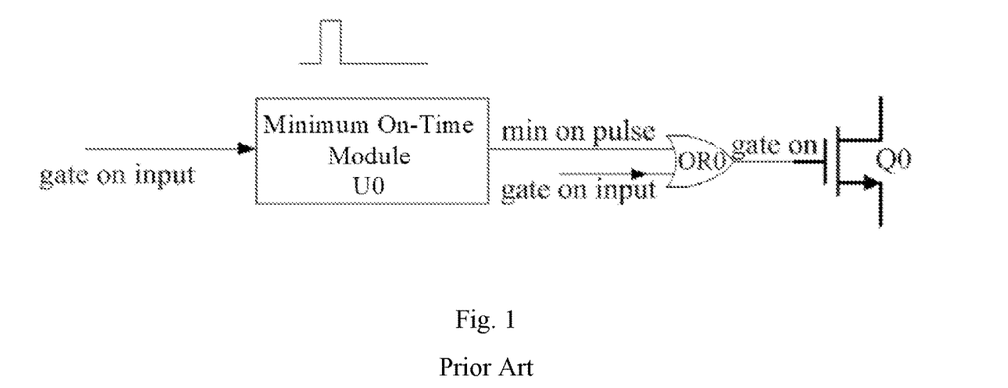
FIG. 1 is a schematic diagram illustrating the structure of a conventional minimum on-time circuit.

Referring to FIG. 1, in a conventional minimum on-time circuit, a minimum on-time module U0 outputs, based on a control signal (labeled in the figure as "gate on input") for a transistor switch (or power transistor) Q0, a pulse signal ("min on pulse", with a pulse width equal to a length of the minimum on-time ("min on time")) which is then provided together with the control signal ("gate on input") to an "OR" operation in a logic OR module OR0, resulting in an actual drive signal ("gate on") for the transistor switch Q0. When at a high level, the actual drive signal ("gate on") turns on the transistor switch Q0. When a pulse width of the control signal ("gate on input") is greater than the minimum on-time, nothing is done to the actual drive signal ("gate on"). When the pulse width of the control signal ("gate on input") is less than or equal to the minimum on-time, a high-level interval of the actual drive signal ("gate on") is extended to be as long as the minimum on-time. The control signal ("gate on input") is produced by a control signal generator circuit (not shown) for turning on and off the transistor switch Q0.

In order to detect a current through the transistor switch Q0, the current is sampled and then processed, and the sampling and processing of the current must be finished within a turn-on time of the transistor switch Q0. Since the sampling and processing of the current through the transistor switch Q0 would take some time, detection of the current would be impossible when the minimum on-time of the transistor switch Q0 is shorter than the time required for the sampling and processing.

In view of the above, according to the present invention, when there is a need for current detection within the minimum on-time of the transistor switch Q0, the minimum on-time is extended to be longer than a normal length. Otherwise, the minimum on-time is maintained at the normal length. In this way, the problem of impossible current detection within the minimum on-time of the transistor switch Q0 due to a length of the minimum on-time that is shorter than the time required for sampling and processing of the current can be avoided.

Figure 2:
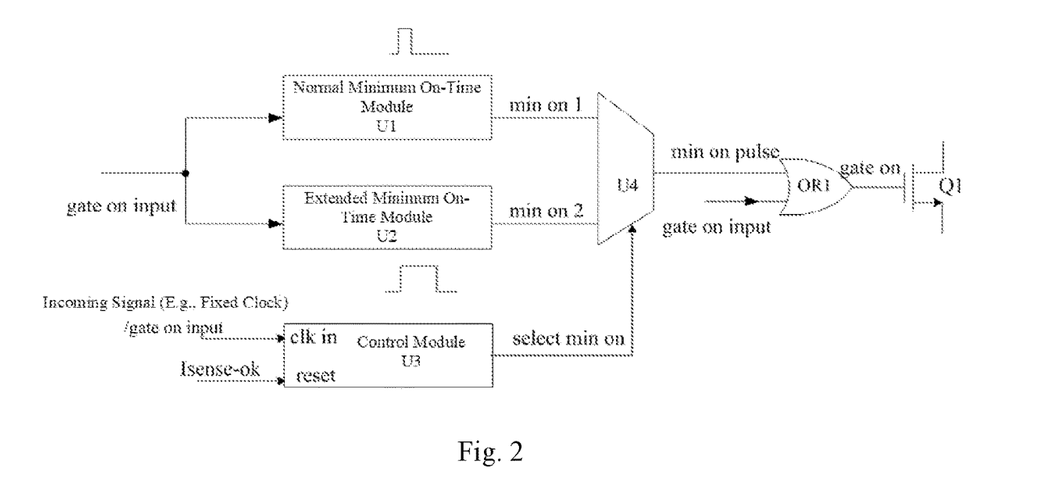
FIG. 2 is a schematic diagram illustrating the structure of a minimum on-time circuit according to an embodiment of the present invention.

Referring to FIG. 2, in one embodiment of the present invention, there is provided a minimum on-time circuit, which is coupled to a transistor switch Q1 and a control signal generator circuit (not shown) for providing a control signal ("gate on input") for turning on and off the transistor switch Q1. This minimum on-time circuit enables the transistor switch Q1 to have a desired minimum on-time based on the control signal ("gate on input") from the control signal generator circuit.

The control signal ("gate on input") generated by the control signal generator circuit is provided to the minimum on-time circuit. The control signal and a pulse signal ("min on pulse") output from the minimum on-time circuit of this embodiment (which is either a first pulse signal ("min on 1") or a second pulse signal ("min on 2")), are provided to an "OR" operation in a logic OR circuit OR1, and a drive signal ("gate on") is output for turning on or off the transistor switch Q1. When both the control signal ("gate on input") and the pulse signal ("min on pulse") are at a low level "0", the drive signal ("gate on") is at a low level "0" and turns off the transistor switch Q1. When either or both of the control signal ("gate on input") and the pulse signal ("min on pulse") is at a high level "1", the drive signal ("gate on") is at a high level "1" and turns on the transistor switch Q1.

According to this embodiment, the minimum on-time circuit includes a normal minimum on-time module U1, an extended minimum on-time module U2, a control module U3 and a selection module U4.

The normal minimum on-time module U1 is configured to output a first pulse signal ("min on 1") based on the control signal ("gate on input") for the transistor switch Q1. The first pulse signal ("min on 1") is a normal minimum on-time pulse signal, and a pulse width of the first pulse signal ("min on 1") is equal to a length of the normal minimum on-time of the transistor switch Q1. It may be implemented by the circuit design of the minimum on-time module U0 in the conventional minimum on-time circuit shown in FIG. 1.

The extended minimum on-time module U2 is configured to output a second pulse signal ("min on 2") based on the control signal ("gate on input") for the transistor switch Q1. The second pulse signal ("min on 2") is an extended minimum on-time pulse signal, and a pulse width of the second pulse signal ("min on 2") is equal to an extended minimum on-time length desired by the transistor switch Q1. The length of the extended minimum on-time is greater than the length of the normal minimum on-time corresponding to the first pulse signal ("min on 1") (i.e., the pulse width of the second pulse signal ("min on 2") is greater than the pulse width of the first pulse signal ("min on1")). In this way, when there is a need to detect a current through the transistor switch Q1 within the minimum on-time of the transistor switch Q1, the minimum on-time can be extended to ensure success of the current detection by an associated current detection circuit.

In this embodiment, the pulse width of the second pulse signal ("min on 2") output from the extended minimum on-time module U2 may be constant. The extended minimum on-time module U2 may include a conventional pulse generator, flip-flop or the like known in the art.

An input terminal of the selection module U4 is coupled to both an output terminal of the normal minimum on-time module U1 and an output terminal of the extended minimum on-time module U2. Moreover, in this embodiment, an output terminal of the selection module U4 is coupled to a gate of the transistor switch Q1 via the logic OR circuit OR1. The selection module U4 is configured to select one of the first pulse signal ("min on 1") and the second pulse signal ("min on 2") as a minimum on-time signal ("min on pulse") for the transistor switch Q1, which is provided to the logic OR circuit OR1. In response, the logic OR circuit OR1 outputs the drive signal ("gate on") to the gate of the transistor switch Q1. The selection module U4 may be implemented as a conventional selection device known in the art, such as a multiplexer.

Figure 3:
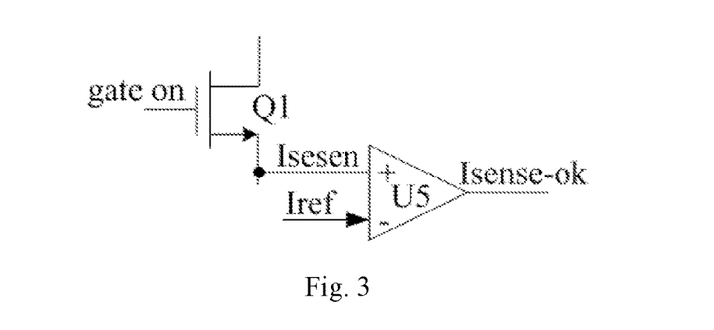
FIG. 3 is a schematic diagram illustrating the structure of a circuit for generating a signal "Isense-ok" in a minimum on-time circuit according to an embodiment of the present invention.

Referring to FIGS. 2 and 3, an output terminal of the control module U3 is coupled to a control terminal of the selection module U4 so as to be able to output a selection signal ("select min on") to the selection module U4. An input terminal of the control module U3 is coupled to an output terminal of the current detection circuit (see FIG. 3). The current detection circuit is coupled to a source or drain of the transistor switch Q1 and configured to detect a current through the transistor switch Q1 and provide, based on a result of the detection, an output signal ("Isense-ok") to the control module U3. The control module U3 is configured to cause the selection module U4 to select and output the second pulse signal ("min on 2") under a certain condition where there is a need for current detection within the minimum on-time of the transistor switch Q1, or otherwise, the first pulse signal ("min on 1") under any other condition except the certain condition. Under the certain condition, the control signal ("gate on input") generally has a pulse width less than or equal to the pulse width of the first pulse signal ("min on 1"), and the drive signal ("gate on") output from the logic OR circuit OR1 has a pulse width equal to the pulse width of the first pulse signal ("min on 1"). Under any other condition except the certain condition, the control signal ("gate on input") generally has a pulse width equal to or greater than the pulse width of the second pulse signal ("min on 2"), and the drive signal ("gate on") output from the logic OR circuit OR1 has a pulse width equal to the pulse width of the control signal ("gate on input").

Referring to FIG. 2, under the certain condition where there is a need for current detection within the minimum on-time of the transistor switch Q1, the control module U3 is configured to count the number of consecutive cycles of the control signal ("gate on input"), or time a continuous period of time of an input signal (which may be a fixed clock signal optionally produced by a clock oscillator), which has or have elapsed since a failed attempt to detect a current through the transistor switch Q1. When a predefined condition is met, it is also configured to cause the selection module U4 to select and output the second pulse signal ("min on 2").

In some embodiments, the control module U3 is configured to count, under the certain condition where there is a need for current detection within the minimum on-time of the transistor switch Q1, the number of consecutive cycles of the control signal ("gate on input") that have elapsed since a failed attempt to detect a current through the transistor switch Q1 and, upon the number reaching a threshold, cause the selection module U4 to select and output the second pulse signal ("min on 2"). In some other embodiments, the control module U3 is configured to time, under the certain condition where there is a need for current detection within the minimum on-time of the transistor switch Q1, a continuous period of time of an input input (which may be a fixed clock signal) that has elapsed since a failed attempt to detect a current through the transistor switch Q1 and, upon the period reaching a threshold, cause the selection module U4 to select and output the second pulse signal ("min on 2").

Referring to FIGS. 2 and 3, under the certain condition, the current detection circuit may be required to detect within the minimum on-time of the transistor switch Q1 a current ("Isense") through the transistor switch Q1 exceeding a predetermined current Iref. However, the time required for sampling and processing of the current ("Isense") (e.g., the time required for the current ("Isense") to ramp from 0 to Iref or a higher level than Iref after the transistor switch Q1 is turned on) may be longer than the length of the normal minimum on-time of the conventional transistor switch Q1. Consequently, the conventional current detection circuit may fail to detect such a current ("Isense") exceeding the predetermined current Iref over a number of consecutive cycles of the control signal ("gate on input") or a continuous period of time of the input signal, leading to a continuous low level of the output signal ("Isense-ok") that it provides to the control module U3 over the period. In response to such a continuous low level of Isense-ok, the control module U3 may output selection signal ("select min on") (e.g., cause a transition from a low level to a high level) according to the corresponding number of consecutive cycles of the control signal ("gate on input") or continuous period of time of the input signal (e.g., determine whether it reaches a predetermined value). In this way, the control module U3 can cause the selection module U4 to output the second pulse signal ("min on 2") instead, thereby extending a high-level interval output from the logic OR circuit OR1 and hence the turn-on time of the transistor switch Q1 (i.e., causing it to have the extended minimum on-time). As such, the current detection circuit is given sufficient time to successfully detect a current ("Isense") through the transistor switch Q1 exceeding the predetermined current Iref within a turn-on time of the transistor switch Q1 (i.e., succeed in current detection within the extended minimum on-time of the transistor switch Q1). When this occurs, the output signal ("Isense-ok") of the current detection circuit is raised from the low level to a high level and maintained at the high level until a falling edge of the second pulse signal ("min on 2") or of the drive signal ("gate on") occurs. In response to Isense-ok dropping from the high level to the low level, the control module U3 switches the selection signal ("select min on") from the high level to the low level, causing the selection module U4 to again select and output the first pulse signal ("min on1").

It is to be noted that the counted or timed value of the control module U3 is cleared to zero not as soon as the output signal ("Isense-ok") transitions from the low level to the high level but at a time synchronized with the current cycle of the control signal ("gate on input"). Preferably, the counted or timed value of the control module U3 is set to zero before the next cycle of the control signal ("gate on input") begins. This ensures integrity of the selection ("select min on") and other signals in the current cycle, while avoiding control module U3 from counting or timing the current cycle or the cycle in which a current through the transistor switch Q1 is successfully detected within the minimum on-time. As such, accurate subsequent counting or timing of the control module U3 can be ensured.

Specifically, referring to FIGS. 2 and 3, the current detection circuit may include a current comparator U5. A first input terminal of the current comparator U5 is coupled to the source of the transistor switch Q1 (or to the drain of the transistor switch Q1 in alternative embodiments) in order to be able to receive a current ("Isense") from the transistor switch Q1. A second input terminal of the current comparator U5 receives the predetermined current Iref. An output terminal of the current comparator U5 is coupled to the input terminal of the control module U3.

An operational timing sequence of the minimum on-time circuit according to this embodiment will be described below with reference to FIGS. 2 to 4.

At the beginning (under a normal operating condition other than the aforementioned certain condition), a pulse width of the control signal ("gate on input") is usually equal to or greater than a pulse width of the second pulse signal ("min on 2"), and a pulse width of the drive signal ("gate on") output from the logic OR circuit OR1 is equal to the pulse width of the control signal ("gate on input"). The turn-on time of the transistor switch Q1 is controlled by the high-level interval of the drive signal ("gate on"). In this case, the current comparator U5 can determine by comparison a current ("Isense") through the transistor switch Q1 exceeding the predetermined current Iref. That is, the current detection circuit can succeed in current ("Isense") detection within the turn-on time of the transistor switch Q1. After the output signal ("Isense-ok") from the current comparator U5 transitions from the low level "0" to the high level "1", the high-level output signal ("Isense-ok") can clear a counted or timed value in the control module U3 to zero before the next cycle of the control signal ("gate on input") begins. This ensures integrity of the selection ("select min on") and other signals in the current cycle and accurate subsequent counting or timing of the control module U3. Upon the drive signal ("gate on") transitioning from the high level "1" to the low level "0", the transistor switch Q1 is turned off, and Isense-ok transitions from the high level "1" to the low level "0". That is, the high-level interval of the output signal ("Isense-ok") lasts until a falling edge of the drive signal (i.e., a falling edge of the control signal ("gate on input")) occurs. In this way, a first high-level pulse of the output signal ("Isense-ok") is formed as shown in FIG. 4, which has a pulse width that is equal to the turn-on time of the transistor switch Q1 minus "the time required for current sampling and processing". In other words, a falling edge of the first high-level pulse of the output signal ("Isense-ok") is aligned with the falling edge of the control signal ("gate on input") (i.e., the current falling edge of the drive signal ("gate on")).

Next, the pulse width of the control signal ("gate on input") is modulated so as to be less than or equal to the pulse width of the first pulse signal ("min on 1"), causing a switch from the normal operating condition to the certain condition where there is a need for current detection within the minimum on-time of the transistor switch Q1. As a result, a pulse width of the drive signal ("gate on") output from the logic OR circuit OR1 is equal to a pulse width of the pulse signal ("min on pulse") output from the selection module U4. Given the output signal ("Isense-ok") of the current detection circuit remains at the low level, the selection signal ("select min on") output from the control module U3 is also low. Accordingly, the selection module U4 selects and outputs the first pulse signal ("min on 1") as the current minimum on-time ("min on pulse"). Obviously, before the selection module U4 switches to output the second pulse signal ("min on 2") as "min on pulse", the turn-on time length of the transistor switch Q1 is equal to the length of the normal minimum on-time determined by the first pulse signal ("min on 1"). Within this normal minimum on-time, it is impossible for the current comparator U5 to detect a current through the transistor switch Q1, leading to a continuous low level "0" of Isense-ok. A counter in the control module U3 counts the number of consecutive cycles of the control signal ("gate on input") in the period when Isense-ok is continuously at the low level "0", and upon the counted value exceeding a threshold count N, the selection signal ("select min on") output from the control module U3 is raised from the low level to the high level and thereby causes the selection module U4 to select and output the second pulse signal ("min on 2") as "min on pulse". As a result, the drive signal ("gate on") has the same waveform as "min on 2", and the turn-on time length of the transistor switch Q1 is instead equal to the extended minimum on-time length. Within this extended minimum on-time, the current comparator U5 is able to detect a current ("Isense") through the transistor switch Q1 and compares it with the predetermined current Iref. When the current ("Isense") through the transistor switch Q1 rises above the predetermined current Iref, the output signal ("Isense-ok") transitions from the low level "0" to the high level "1" and remains at the high level until the transistor switch Q1 is turned off. In this way, a second high-level pulse of the output signal ("Isense-ok") is formed as shown in FIG. 4, which has a pulse width that is equal to the extended minimum on-time length minus "the time required for current sampling and processing". That is, a falling edge of the second high-level pulse of Isense-ok is aligned with a falling edge of the second pulse signal ("min on 2") (i.e., the falling edge of the drive signal ("gate on")).

In other words, after a need arises for current detection through the transistor switch Q1 within the minimum on-time, throughout N consecutive cycles of the control signal ("gate on input") in which current detection is impossible, "min on pulse" and the drive signal ("gate on") have the same waveform as the first pulse signal ("min on 1"). After the signal "min on pulse" is switched to become the second pulse signal ("min on 2") for enabling current detection through the transistor switch Q1, the signal "min on pulse" and the drive signal ("gate on") instead assumes the same waveform as the second pulse signal ("min on 2"). At the end of the high-level interval of Isense-ok, the selection signal ("select min on") output from the control module U3 transitions from the high level to the low level, causing the selection module U4 to again output the first pulse signal ("min on 1"). As a result, the signal "min on pulse" and the drive signal ("gate on") again have the same waveform as the first pulse signal ("min on 1").

Additionally, in any turn-off time of the transistor switch Q1, a current ("Isense") through the transistor switch Q1 is equal or close to zero, and the current comparator U5 is idle. Accordingly, the current comparator U5 determines by comparison that the current ("Isense") is smaller than the predetermined current Iref and outputs Isense-ok at the low level "0", resulting in the low-level waveform of the output signal ("Isense-ok") as shown in FIG. 4.

It would be appreciated that, although the control module U3 has been described in the above embodiment as including a counter configured to receive the control signal ("gate on input") and the output signal ("Isense-ok") and take a count of consecutive cycles of the control signal ("gate on input") in the period in which current detection through the transistor switch is impossible as a criterion for determining whether to switch to the extended minimum on-time (i.e., if the current detection circuit cannot detect a current through the transistor switch Q1 over N consecutive cycles of the control signal, a switch to the extended minimum on-time is effected), the present invention is not so limited, as whether to switch to the extended minimum on-time may be alternatively determined based on any other suitable criterion, such as whether a current through the transistor switch Q1 cannot be detected by the current detection circuit over a predetermined period of time.

Specifically, in another embodiment of the present invention, the control module U3 includes a timer configured to receive an input signal and the output signal ("Isense-ok"), and when under the certain condition where there is a need for current detection within the minimum on-time of the transistor switch Q1, time a continuous period of time of the input signal, over which a current through the transistor switch Q1 cannot be detected. Moreover, when the timed value reaches a threshold, the selection module U4 is caused to select and output the second pulse signal ("min on 2") as the signal "min on pulse". Otherwise, under any other condition except the certain condition, the control module U3 instructs the selection module U4 to select and output the first pulse signal ("min on 1") as the signal "min on pulse". Under the certain condition, a pulse width of the control signal ("gate on input") is less than or equal to the pulse width of the first pulse signal ("min on 1"), and a pulse width of the drive signal ("gate on") output from the logic OR circuit OR1 is equal to the pulse width of the first pulse signal ("min on 1"). Under any other condition except the certain condition, the control signal ("gate on input") has a pulse width equal to or greater than the pulse width of the second pulse signal ("min on 2"), and a pulse width of the drive signal ("gate on") output from the logic OR circuit OR1 is equal to the pulse width of the control signal ("gate on input"). As an example, the input signal received by the timer is a fixed clock signal having a frequency of 1 kHz and a repeating cycle of 1 ms. When the continuous period of time of the input signal, over which current detection through the transistor switch Q1 is impossible, (i.e., the timed value) reaches 10 ms (the timing may be accomplished by counting the fixed clock signal 10 times), i.e., when a current is not detected over a continuous period of 10 ms, the control module U3 may cause the selection module U4 to switch to output the second pulse signal ("min on2").

Figure 4:
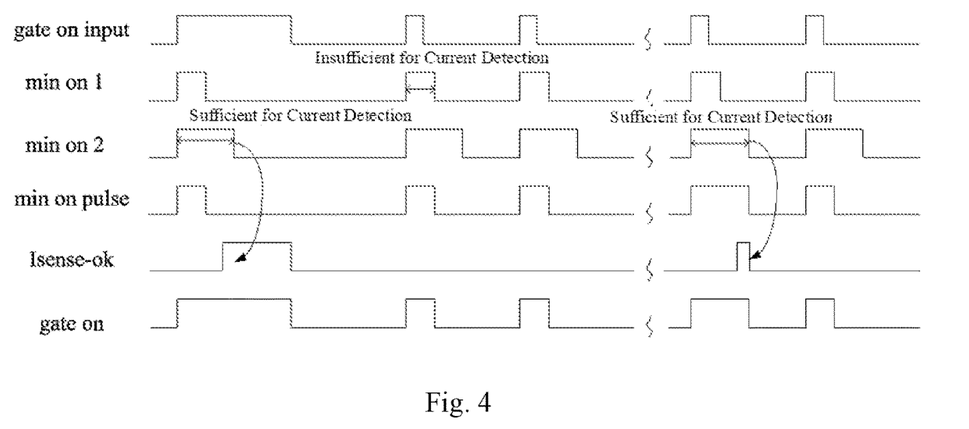
FIG. 4 shows an operational timing sequence of the minimum on-time circuit of FIG. 3.

An operational timing sequence of the minimum on-time circuit according to this embodiment is similar to that shown in FIG. 4 and, therefore, needs not be described in further detail herein.

In the above embodiments, following the output signal ("Isense-ok") from the current detection circuit transitioning from the low level "0" to the high level "1", the counter or timer is reset and outputs zero.

Figure 7:
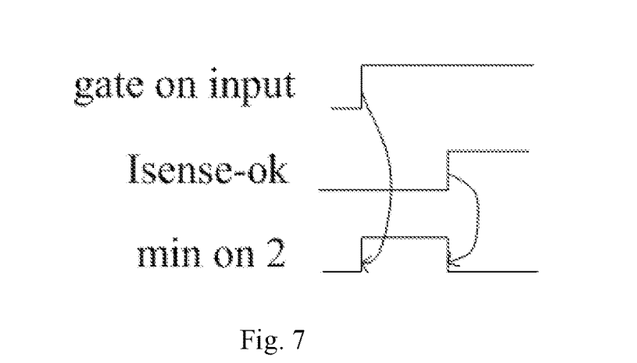
FIG. 7 schematically illustrates a relationship between a pulse width of an output signal from the flip-flop of FIG. 6 and input signals.

Additionally, although the extended minimum on-time has been described as being achieved by extending the minimum on-time, i.e., by providing the second pulse signal ("min on 2") whose pulse width is constant and greater than the pulse width of the first pulse signal ("min on 1") in the above embodiments, the present invention is not so limited. In other embodiments of the present invention, the extended minimum on-time may also be achieved by making the pulse width of the second pulse signal ("min on 2") (i.e., the extended minimum on-time length) variable within a range above the pulse width of the first pulse signal ("min on 1"). For example, in another embodiment of present invention as shown in FIG. 7, under the certain condition, a rising edge of the second pulse signal ("min on 2") is determined by a rising edge of the control signal ("gate on input") and a falling edge thereof by a rising edge of the signal Isense-ok so that a current through the transistor switch Q1 can be detected within the minimum on-time. That is, a high-level interval of the second pulse signal ("min on 2") lasts until the current detection circuit is able to detect the current ("Isense") within the minimum on-time of the transistor switch Q1("Isense") and the current becomes greater than the predetermined current Iref.

Figure 5:
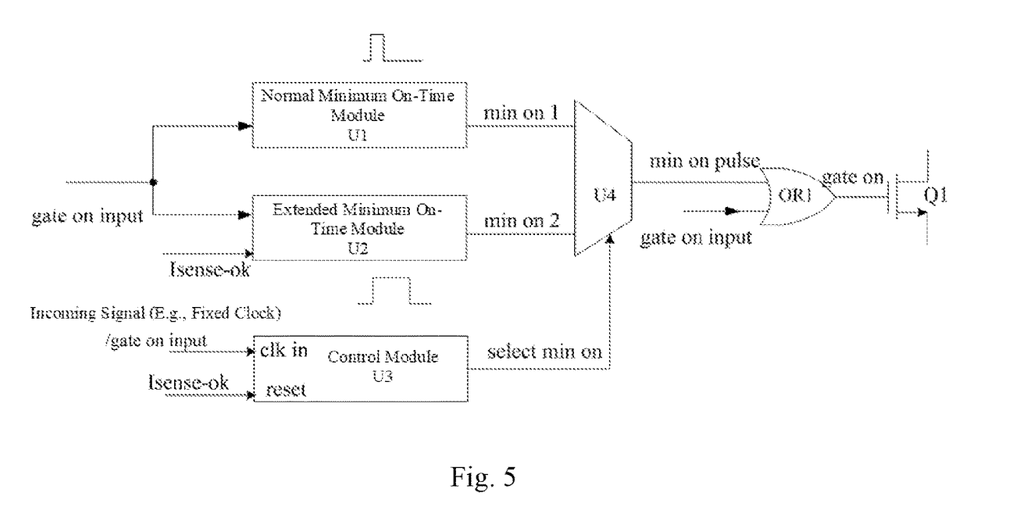
FIG. 5 is a schematic diagram illustrating the structure of a minimum on-time circuit according to another embodiment of the present invention.

Specifically, referring to FIG. 5, in another embodiment of the present invention, there is provided a minimum on-time circuit, which also includes a normal minimum on-time module U1, an extended minimum on-time module U2, a control module U3 and a selection module U4. Since these modules are connected to one another and the minimum on-time circuit to the logic OR circuit OR1 and the transistor switch Q1 in the same manner as in the above embodiments, it needs not be described in further detail herein.

This embodiment differs from the above embodiments in that an output terminal of the current detection circuit is further coupled to an input terminal of the extended minimum on-time module U2 in order to enable the extended minimum on-time module U2 to receive an output signal ("Isense-ok") from the current detection circuit and to output a second pulse signal ("min on 2") with a variable pulse width based on a control signal ("gate on input") and the output signal ("Isense-ok"). Of course, in other embodiments, the extended minimum on-time module U2 may be alternatively configured to output a second pulse signal ("min on 2") with a fixed pulse width based on the control signal ("gate on input") and the output signal ("Isense-ok").

Figure 6:
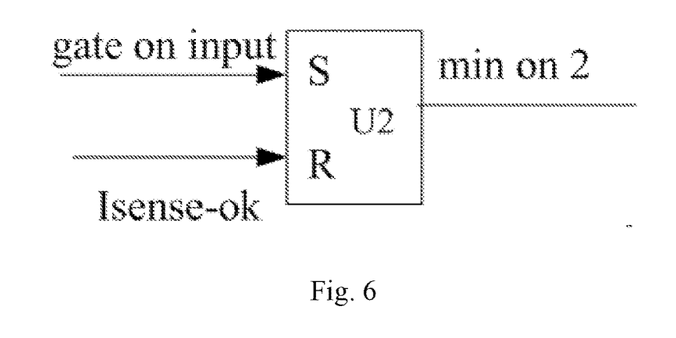
FIG. 6 is a schematic diagram illustrating the structure of a flip-flop in an extended minimum on-time module of FIG. 5.

As an example, referring to FIG. 6, the extended minimum on-time module U2 may include a flip-flop (e.g., an RS flip-flop). One input terminal of the flip-flop may receive the control signal ("gate on input"), and another input terminal thereof may receive the output signal ("Isense-ok"). The second pulse signal ("min on 2") may be output from an output terminal of the flip-flop.

An operational timing sequence of the minimum on-time circuit according to this embodiment will be described below with reference to FIGS. 5 to 8.

Figure 8:
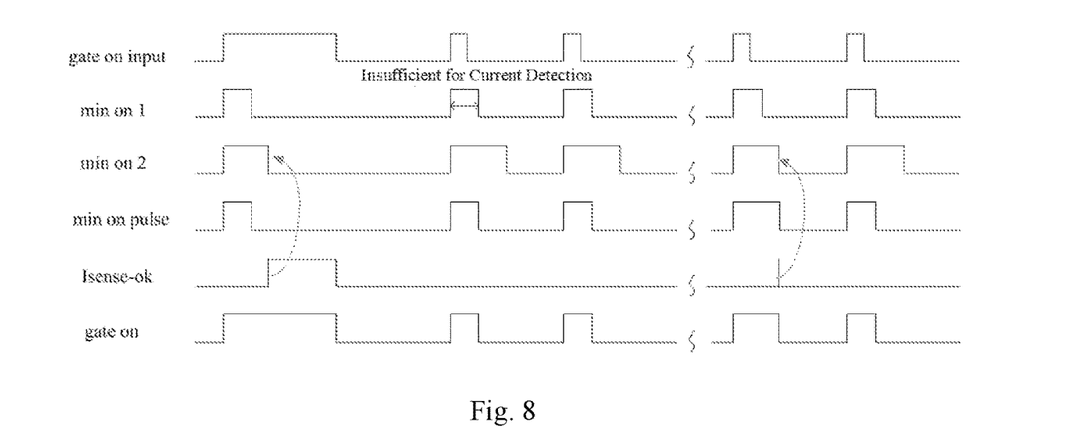
FIG. 8 shows an operational timing sequence of the minimum on-time circuit of FIG. 5.
Figure 9:
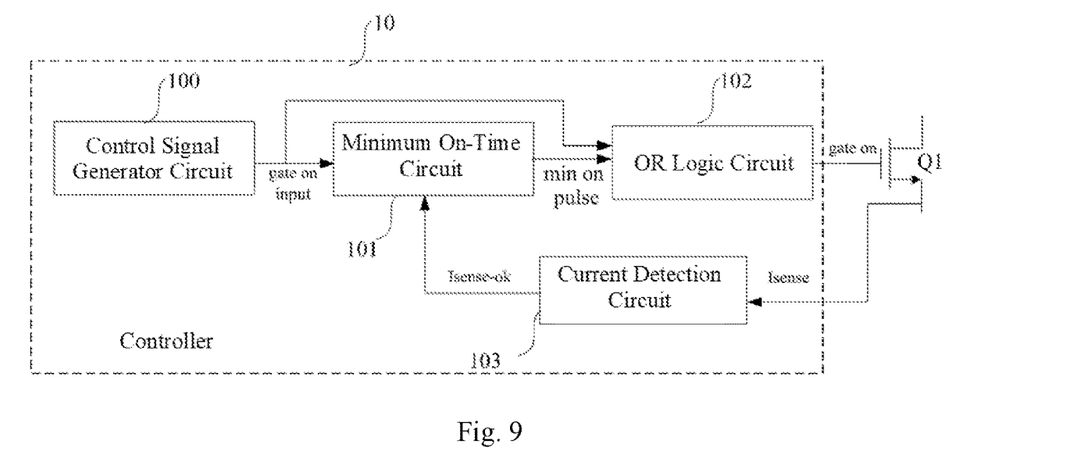
FIG. 9 is a schematic diagram illustrating the system architecture of a controller according to a particular embodiment of the present invention.

At the beginning (under a normal operating condition other than a certain condition), a pulse width of the control signal ("gate on input") is usually equal to or greater than a pulse width of the second pulse signal ("min on 2"), and a pulse width of a drive signal ("gate on") output from the logic OR circuit OR1 is equal to the pulse width of the control signal ("gate on input"). A turn-on time of the transistor switch Q1 is controlled during a high-level interval of the drive signal ("gate on"). In this case, a current comparator U5 can determine by comparison a current ("Isense") through the transistor switch Q1 exceeding a predetermined current Iref within the turn-on time. That is, the current detection circuit can succeed in current ("Isense") detection within the turn-on time of the transistor switch Q1. After the output signal ("Isense-ok") from the current comparator U5 transitions from a low level "0" to a high level "1", the high-level output signal ("Isense-ok") can clear a counted or timed value in the control module U3 to zero before the next cycle of the control signal ("gate on input") begins. This ensures integrity of the selection ("select min on") and other signals in the current cycle and accurate subsequent counting or timing of the control module U3. Upon the drive signal ("gate on") transitioning from the high level "1" to the low level "0", the transistor switch Q1 is turned off, and Isense-ok transitions from the high level "1" to the low level "0". That is, the high-level interval of the output signal ("Isense-ok") lasts until a falling edge of the drive signal (i.e., a falling edge of the control signal ("gate on input")) occurs. In this way, a first high-level pulse of the output signal ("Isense-ok") is formed as shown in FIG. 8, which has a pulse width that is equal to the turn-on time of the transistor switch Q1 minus "the time required for current sampling and processing". In other words, a falling edge of the first high-level pulse of the output signal ("Isense-ok") is aligned with the falling edge of the control signal ("gate on input") (i.e., the current falling edge of the drive signal ("gate on")).

Next, the pulse width of the control signal ("gate on input") is modulated so as to be less than or equal to the pulse width of a first pulse signal ("min on 1"), causing a switch from the normal operating condition to the certain condition where there is a need for current detection within the minimum on-time of the transistor switch Q1. As a result, a pulse width of the drive signal ("gate on") output from the logic OR circuit OR1 is equal to a pulse width of the pulse signal ("min on pulse") output from the selection module U4. Given the output signal ("Isense-ok") of the current detection circuit remains at the low level, the selection signal ("select min on") output from the control module U3 is also low. Accordingly, the selection module U4 selects and outputs the first pulse signal ("min on 1") as the current minimum on-time signal ("min on pulse"). Obviously, before the selection module U4 switches to output the second pulse signal ("min on 2") as "min on pulse", a turn-on time of the transistor switch Q1 is equal to a normal minimum on-time determined by the first pulse signal ("min on 1"). Within this normal minimum on-time, it is impossible for the current comparator U5 to detect a current through the transistor switch Q1, leading to a continuous low level "0" of Isense-ok. A counter in the control module U3 counts the number of consecutive cycles of the control signal ("gate on input"), or a timer in the control module U3 times a continuous period of time of an input signal, in the period when Isense-ok is continuously at the low level "0", and upon the counted value exceeding a threshold count N, or upon the timed value exceeding an associated threshold, the selection signal ("select min on") output from the control module U3 is raised from the low level to the high level and thereby causes the selection module U4 to select and output the second pulse signal ("min on 2") as "min on pulse". Moreover, a rising edge of a second pulse signal ("min on 2") is determined by a rising edge of the control signal ("gate on input"), and the drive signal ("gate on") has the same waveform as "min on 2", extending the turn-on time of the transistor switch Q1 to an extended minimum on-time corresponding to the second pulse signal ("min on 2"). Within this extended minimum on-time, the current comparator U5 is able to detect a current ("Isense") through the transistor switch Q1 and determine by comparison that the current ("Isense") through the transistor switch Q1 becomes larger than a predetermined current threshold, i.e., the output signal ("Isense-ok") transitions from the low level "0" to the high level "1". As soon as this happens, the high-level interval of the second pulse signal ("min on 2") is terminated, and the falling edge of the second pulse signal ("min on 2") is therefore instead determined by a rising edge of the output signal ("Isense-ok"). Meanwhile, as soon as the second pulse signal ("min on 2") transitions from the high level to the low level, the drive signal ("gate on") also transitions from the high level to the low level, turning off the transistor switch Q1. Accordingly, the output signal ("Isense-ok") transitions from the high level "1" to the low level "0", resulting in a second pulse of the output signal ("Isense-ok") as shown in FIG. 8 (which is so narrow as to appear like a vertical line).

In other words, in this embodiment, after a need arises for current detection through the transistor switch Q1 within the minimum on-time, throughout N consecutive cycles of the control signal ("gate on input") or a continuous period of time of the input signal, in which current detection is impossible, the signal "min on pulse" and the drive signal ("gate on") have the same waveform as the first pulse signal ("min on 1"). After the signal "min on pulse" is switched to become the second pulse signal ("min on 2") for enabling current detection through the transistor switch Q1, the signal "min on pulse" and the drive signal ("gate on") instead assume the same waveform as the second pulse signal ("min on 2"). Subsequently, at the end of the high-level interval of Isense-ok, the selection signal ("select min on") output from the control module U3 transitions from the high level to the low level, causing the selection module U4 to again output the first pulse signal ("min on 1"). As a result, the signal "min on pulse" and the drive signal ("gate on") again have the same waveform as the first pulse signal ("min on 1").

Additionally, during any turn-off time of the transistor switch Q1, a current ("Isense") through the transistor switch Q1 is equal or close to zero, and the current comparator U5 is idle. Accordingly, the current comparator U5 determines by comparison that the current ("Isense") is smaller than the predetermined current Iref and outputs Isense-ok at the low level "0", resulting in the low-level waveform of the output signal ("Isense-ok") as shown in FIG. 8.

Apparently, under any other condition rather than the aforementioned certain condition (i.e., under the normal operating condition), since the pulse width of the control signal ("gate on input") is usually equal to or greater than the pulse width of the second pulse signal ("min on 2"), the pulse width of the drive signal ("gate on") from the logic OR circuit OR1 is equal to the pulse width of the control signal ("gate on input"), and the turn-on time of the transistor switch Q1 is equal to the pulse width of the control signal ("gate on input"). Within this turn-on time of the transistor switch Q1, when determining by comparison that Isense is greater than Iref, the current detection circuit is able to output Isense-ok at the high level.

Referring to FIGS. 2 to 9, in an embodiment of the present invention, there is also provided a controller 10 including a control signal generator circuit 100, a logic OR circuit 102 (which can be implemented as the logic OR circuit OR1 described above), a current detection circuit 103 and a minimum on-time circuit 101 according to any embodiment of the present invention. An output terminal of the control signal generator circuit 100 is coupled to input terminals of normal and extended minimum on-time modules U1, U2 in the minimum on-time circuit 101 and to a second input terminal of the logic OR circuit 102 in order to provide them with a control signal ("gate on input") corresponding to the transistor switch Q1. A first input terminal of the logic OR circuit 102 is coupled to an output terminal of the selection module U4 in the minimum on-time circuit 101, and an output terminal of the logic OR circuit 102 is coupled to a gate of the transistor switch Q1. An input terminal of the current detection circuit 103 (corresponding to the first input terminal of the aforementioned current comparator U5) is coupled to a source or drain of the transistor switch Q1, and an output terminal of the current detection circuit 103 (corresponding to the output terminal of the current comparator U5) is coupled to an input terminal of a control module U3 in the minimum on-time circuit 101. The current detection circuit 103 is configured to detect a current through the transistor switch Q1 (corresponding to a source or drain current in an on-state of the transistor switch Q1), and provide, based on a result of the detection, a corresponding output signal ("Isense-ok") to the control module U3 in the minimum on-time circuit 101.

Optionally, referring to FIG. 3, the current detection circuit 103 may include a current comparator U5, which includes: a first input terminal coupled to the source or drain of the transistor switch Q1; a second input terminal for receiving a predetermined current Iref; and an output terminal coupled to the input terminal of the control module U3.

Figure 10:
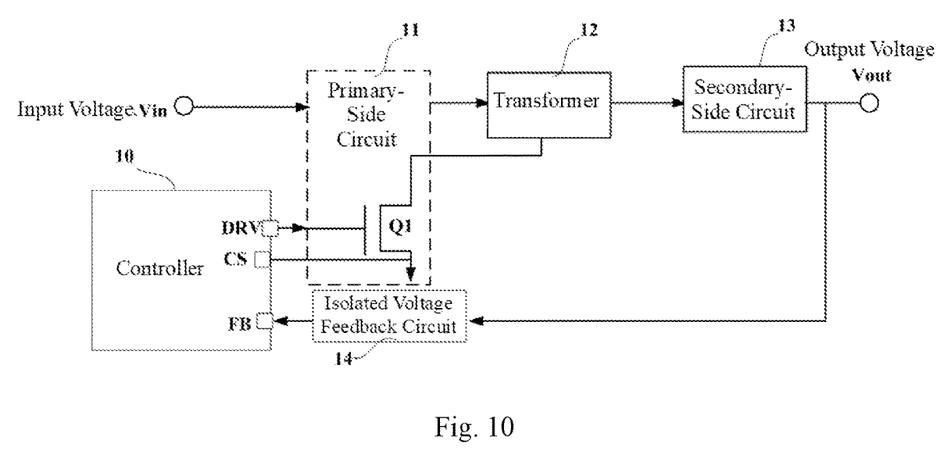
FIG. 10 is a schematic diagram illustrating the system architecture of a power supply according to a particular embodiment of the present invention.

Referring to FIG. 10, in an embodiment of the present invention, there is also provided a circuit system (i.e., power supply), which includes a transistor switch Q1 and a controller 10 according to any embodiment of the present invention. The transistor switch Q1 may be integrated in the controller 10, or disposed outside of the controller 10.

As an example, the circuit system may further include a primary-side circuit 11, a transformer 12, a secondary-side circuit 13 and an isolated voltage feedback circuit 14. The transformer 12 may include a primary-side winding and a secondary-side winding. The transistor switch Q1 may be provided in the primary-side circuit 11 so as to be located outside the controller 10, and the primary-side winding may be connected to the transformer 12. The controller 10 may be configured to turn on or off the transistor switch Q1. The primary-side circuit 11 may receive an input voltage Vin, and the secondary-side circuit 13 may be connected to the secondary-side winding in the transformer 23 and configured to provide an output voltage Vout to an associated load (not shown). The controller 10 may have at least a feedback pin FB, a current detection pin CS and a drive pin DRV. The isolated voltage feedback circuit 14 may be connected to an output terminal of the secondary-side circuit 13 and the feedback pin FB of the controller 10 so as to be able to feed the output voltage Vout back to the controller 10. The drive pin DRV of the controller 10 may be connected to the gate of the transistor switch Q1 in the primary-side circuit 11, and the current detection pin CS may be connected to the source of the transistor switch Q1. A corresponding control signal ("gate on input") may be produced based on a signal from the feedback pin FB, and the drive pin DRV may output a corresponding drive signal ("gate on") for turning on or off the transistor switch Q1 based on the control signal ("gate on input") and a signal from the current detection pin.

It is to be noted that the above-discussed power supply is merely an example of the present invention and is not intended to limit the scope of the invention in any sense. Any and all circuits system incorporating the transistor switch are intended to be embraced within the scope of the present invention, such as various power supply circuit systems (e.g., switched-mode power supply system and the like), motor drive circuit systems, power circuit system and so forth.

Based on the same inventive concept, referring to FIGS. 2 to 10, in an embodiment of the present invention, there is also provided a current detection method, which may be implemented by a minimum on-time circuit, controller or switched-mode power supply constructed in accordance with the present invention. This current detection method includes: under a certain condition where there is a need for current detection within a minimum on-time of a transistor switch Q1, causing the transistor switch Q1 to have an extended minimum on-time longer than a normal minimum on-time of the transistor switch; and under any other condition except the certain condition, causing, as needed, the transistor switch Q1 to have the normal minimum on-time.

Optionally, the current detection method of this embodiment may further include: applying a control signal ("gate on input") to the transistor switch Q1; and under the certain condition where there is a need for current detection within the minimum on-time of the transistor switch Q1, counting the number of consecutive cycles of the control signal ("gate on input"), or timing a continuous period of time of an input signal, over which a current through the transistor switch Q1 cannot be detected; and a predefined condition is met, causing the transistor switch Q1 to have the extended minimum on-time longer than the normal minimum on-time. Specifically, under the certain condition where there is a need for current detection within the minimum on-time of the transistor switch Q1, the number of consecutive cycles of the control signal ("gate on input"), over which a current through the transistor switch Q1 cannot be detected, may be counted, and upon the counted value reaching a threshold count, the transistor switch Q1 may be caused to have the extended minimum on-time longer than the normal minimum on-time. Alternatively, a continuous period of time of the input signal, over which a current through the transistor switch Q1 cannot be detected, may be timed, and when the timed value reaches a threshold, the transistor switch Q1 may be caused to have the extended minimum on-time longer than the normal minimum on-time.

The extended minimum on-time is constant or variable.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:
1. A minimum on-time circuit, comprising:
a normal minimum on-time module configured to output a first pulse signal based on a control signal for a transistor switch, wherein a pulse width of the first pulse signal is equal to a length of a normal minimum on-time of the transistor switch;
an extended minimum on-time module configured to output a second pulse signal based on the control signal, wherein a pulse width of the second pulse signal is equal to a length of an extended minimum on-time of the transistor switch, and the length of the extended minimum on-time is greater than the length of the normal minimum on-time;
a selection module comprising an input terminal coupled to the normal minimum on-time module and the extended minimum on-time module and an output terminal coupled to a gate of the transistor switch, the selection module configured to select one of the first and second pulse signals and provide it at the gate of the transistor switch; and
a control module comprising an output terminal coupled to a control terminal of the selection module, the control module configured to cause the selection module to select and output the second pulse signal under a certain condition where there is a need for current detection within the minimum on-time of the transistor switch and to select and output the first pulse signal under any other condition except the certain condition.

2. The minimum on-time circuit of claim 1, wherein an input terminal of the control module is coupled to a current detection circuit for detecting a current through the transistor switch, and the control module is configured to be based on both the control signal or an input signal and an output signal of the current detection circuit to cause the selection module to select and output the second pulse signal under the certain condition.

3. The minimum on-time circuit of claim 2, wherein the control module is configured to, under the certain condition, count a number of consecutive cycles of the control signal, or time a continuous period of time of the input signal, over which a current through the transistor switch cannot be detected, and when a predefined condition is met, cause the selection module to select and output the second pulse signal.

4. The minimum on-time circuit of claim 2, wherein when the selection module selects and outputs the second pulse signal and a current through the transistor switch is greater than a predetermined current, the output signal of the current detection circuit transitions from a low level to a high level, and in response to the second pulse signal transitioning from a high level to a low level, the output signal of the current detection circuit transitions from the high level to the low level.

5. The minimum on-time circuit of claim 3, wherein the control module comprises a counter, which is configured to receive the control signal and the output signal of the current detection circuit and, under the certain condition, count the number of consecutive cycles of the control signal, over which a current through the transistor switch cannot be detected, and when the counted value reaches a counting threshold value, cause the selection module to select and output the second pulse signal; or
wherein the control module comprises a timer, which is configured to receive the input signal and the output signal of the current detection circuit and, under the certain condition, time a continuous period of time of the input signal, over which the current through the transistor switch cannot be detected, and when the timed value reaches a timing threshold value, cause the selection module to select and output the second pulse signal.

6. The minimum on-time circuit of claim 5, wherein in response to the output signal of the current detection circuit transitioning from a low level to a high level, the counter or timer is reset.

7. The minimum on-time circuit of claim 1, wherein the pulse width of the second pulse signal output from the extended minimum on-time module is constant.

8. The minimum on-time circuit of claim 2, wherein the pulse width of the second pulse signal output from the extended minimum on-time module is variable.

9. The minimum on-time circuit of claim 8, wherein the extended minimum on-time module is coupled to the current detection circuit for detecting the current through the transistor switch and configured to receive the control signal and the output signal of the current detection circuit and output the second pulse signal; when the selection module selects and outputs the second pulse signal, in response to the control signal transitioning from a low level to a high level, the second pulse signal transitions from a low level to a high level; and when the current through the transistor switch exceeds the predetermined current, the output signal of the current detection circuit transitions from the low level to the high level, thereby causing the second pulse signal to transition from the high level to the low level and thereby causing the output signal of the current detection circuit to transition from the high level to the low level.

10. The minimum on-time circuit of claim 9, wherein the extended minimum on-time module comprises a flip-flop configured to receive the output signal of the current detection circuit and the control signal and output the second pulse signal; in response to the control signal transitioning from the low level to the high level, the second pulse signal transitions from the low level to the high level; and in response to the output signal of the current detection circuit transitioning from the low level to the high level, the second pulse signal transitions from the high level to the low level.

11. A controller comprising the minimum on-time circuit of claim 1, the minimum on-time circuit being coupled to the gate of the transistor switch.

12. The controller of claim 11, further comprising a control signal generator circuit, a logic OR circuit and a current detection circuit, wherein an output terminal of the control signal generator circuit is coupled to both an input terminal of the minimum on-time circuit and a second input terminal of the logic OR circuit in order to be able to apply a control signal to the transistor switch; a first input terminal of the logic OR circuit is coupled to an output terminal of the minimum on-time circuit and an output terminal of the logic OR circuit is coupled to the gate of the transistor switch in order to be able to provide a drive signal; an input terminal of the current detection circuit is coupled to a source or drain of the transistor switch and an output terminal of the current detection circuit is coupled to the input terminal of the minimum on-time circuit; and the current detection circuit is configured to detect a current through the transistor switch, provide an output signal based on a result of the detection and transmit the output signal to the minimum on-time circuit.

13. The controller of claim 12, wherein the current detection circuit comprises a current comparator, the current comparator having a first input terminal coupled to the source or drain of the transistor switch and a second input terminal for receiving a predetermined current; and when a current through the transistor switch exceeds the predetermined current, the output signal of the current detection circuit transitions from a low level to a high level.

14. A circuit system comprising the transistor switch and the controller of claim 11, wherein the transistor switch is integrated in the controller, or disposed outside of the controller.

15. A current detection method, comprising: under a certain condition where there is a need for current detection within a minimum on-time of a transistor switch, causing the transistor switch to have an extended minimum on-time longer than a normal minimum on-time of the transistor switch; and under any other condition except the certain condition, causing, as needed, the transistor switch to have the normal minimum on-time.

16. The current detection method of claim 15, further comprising: applying a control signal to the transistor switch and, under the certain condition where there is a need for current detection within the minimum on-time of the transistor switch, counting the number of consecutive cycles of the control signal, over which a current through the transistor switch cannot be detected, and when the counted value reaches a counting threshold value, causing the transistor switch to have the extended minimum on-time longer than the normal minimum on-time; or providing an input signal and, under the certain condition where there is a need for current detection within the minimum on-time of the transistor switch, timing a continuous period of time of the input signal, over which a current through the transistor switch cannot be detected, and when the timed value reaches a timing threshold value, causing the transistor switch to have the extended minimum on-time longer than the normal minimum on-time.

17. The current detection method of claim 15, wherein the extended minimum on-time is constant or a variable.

\* \* \* \* \*